(12) United States Patent
Alexanian (10) Patent No.: US 6,567,290 B2
(45) Date of Patent: May 20, 2003

(54) HIGH-SPEED LOW-POWER SEMICONDUCTOR MEMORY ARCHITECTURE

(75) Inventor: Suren A. Alexanian, Los Altos, CA (US)

(73) Assignee: Mosaic Systems, Inc., Fremont, CA (US)

(*) Notice: Subject to any disclaimer, the term of this patent is extended or adjusted under 35 U.S.C. 154(b) by 0 days.

(21) Appl. No.: 09/872,766

(22) Filed: Jun. 1, 2001

(65) Prior Publication Data

US 2002/0012262 A1 Jan. 31, 2002

Related U.S. Application Data (60) Provisional application No. 60/215,781, filed on Jul. 5, 2000.

(51) Int. Cl.[7] ............................................... G11C 5/06
(52) U.S. Cl. ..................... 365/63; 365/51; 365/230.03; 365/72
(58) Field of Search ....................... 365/51, 63, 230.01, 365/230.03

(56) References Cited

U.S. PATENT DOCUMENTS

| | | | |
|---|---|---|---|
| 5,208,491 A | * 5/1993 | Ebeling et al. | ............. 307/465 |
| 5,712,579 A | * 1/1998 | Duong et al. | .................. 326/93 |
| 5,742,181 A | * 4/1998 | Rush | ........................... 326/41 |
| 5,966,027 A | * 10/1999 | Kapusta et al. | ............... 326/39 |
| 6,038,627 A | * 3/2000 | Plants | ........................ 710/126 |
| 6,141,287 A | 10/2000 | Mattausch | |
| 2002/0011870 A1 | * 1/2002 | Kaptanoglu | .................. 326/41 |

* cited by examiner

*Primary Examiner*—Viet Q. Nguyen
(74) *Attorney, Agent, or Firm*—Townsend and Townsend and Crew LLP (57) ABSTRACT

An array block has at least two sub-array blocks and a first interconnect routing channel through which a first group of local interconnect lines extend. Each of the two sub-array blocks includes at least two lower-level sub-array blocks and a second interconnect routing channel through which a second group of local interconnect lines extend. The first group of local interconnect lines are configured to carry input information for accessing memory locations in which to store data or from which to retrieve data, and the second group of local interconnect lines are configured to carry a subset of the input information.

34 Claims, 6 Drawing Sheets

HIGH-SPEED LOW-POWER SEMICONDUCTOR MEMORY ARCHITECTURE

CROSS-REFERENCES TO RELATED APPLICATIONS

This application claims the benefit of U.S. Provisional Application No. 60/215,781 filed Jul. 5, 2000, which disclosure (including its attached document) is incorporated herein by reference in its entirety for all purposes.

BACKGROUND OF THE INVENTION

Figure 1A:
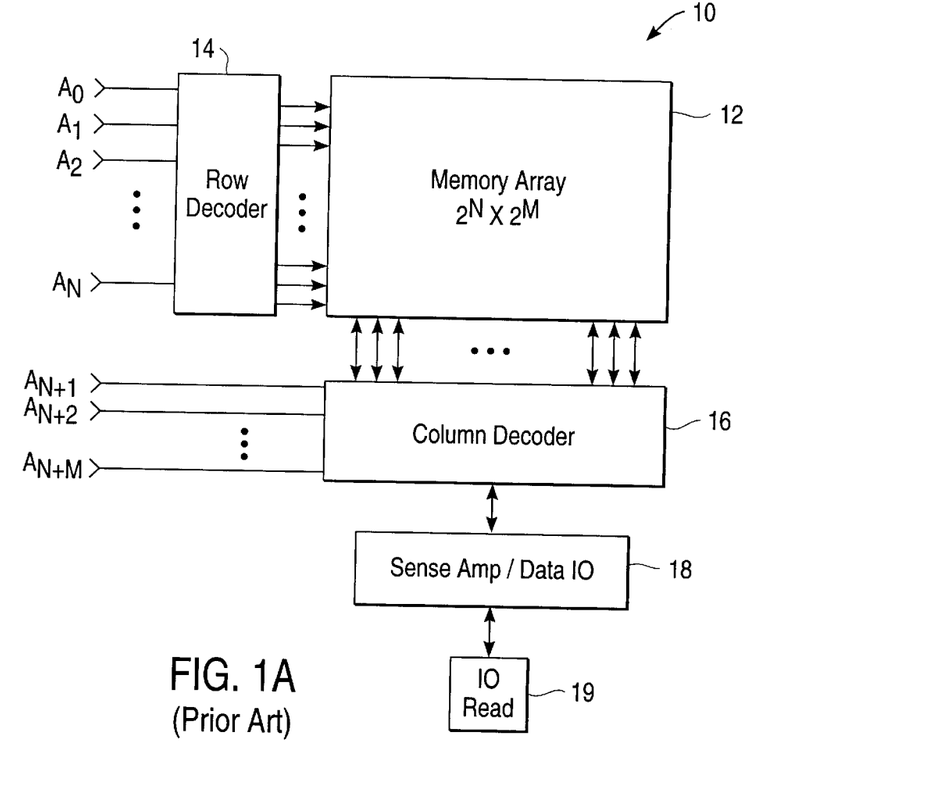
FIGS. 1A and 1B show two conventional memory configurations.

FIG. 1A shows a block diagram of a conventional semiconductor memory architecture 10 commonly used in implementing different types of memories such as volatile memories (e.g., static random access memory (SRAM), dynamic random access memory (DRAM)) and nonvolatile memories (e.g., read only memory (ROM), erasable programmable ROM (EPROM), electrically erasable program ROM (EEPROM), Flash EPROM). Such memories, as shown in FIG. 1A, typically include an array 12 of $2^N$ rows of cells by $2^M$ columns of cells, where N and M represent the number of row and column addresses, respectively. A cell is selected from array 12 via row decoder 14 and column decoder 16. Row decoder 14 receives row addresses $A_0-A_N$ for selecting one of the $2^N$ rows, and simultaneously, column decoder 16 receives column addresses $A_{N+1}-A_{N+M}$ for selecting one of the $2^M$ columns. The selected cell is located at the intersection of the selected row (wordline) and column (bitline).

In a read operation, a signal representing the stored data is transferred from the selected cell to a sense amplifier in block 18 via column decoder 16. The sense amplifier amplifies the cell signal, and transfers it to an output buffer (not shown) which in turn transfers it to IO pad 19 for external use. In a write operation, programming data is externally provided on IO pad 19, and is then transferred to the selected cell via a data IO circuit in block 18 and column decoder 16. Blocks 12, 16, 18 and IO pad 19 may be repeated a number of times depending upon the desired IO data configuration (e.g., by–16 or by–32 data).

The address access time in a read operation (and a write operation for SRAMs and DRAMs) typically consists of time delays through an address buffer (not shown), row decoder 14, memory array 12, column decoder 16, sense amplifier 18, and output buffer (not shown). Of these delays, depending on the memory density, the delay through the memory array typically represents the largest portion of the total time delay because of the RC time constant associated with the long wordlines and the high capacitance associated with the long bitlines. Thus, in a given process technology (e.g., 0.13µm), to achieve high speed, array 12 is typically divided into two or more sub-arrays, thereby reducing the length of wordlines and/or bitlines. An example of such memory configuration is shown in FIG. 1B.

Figure 1B:
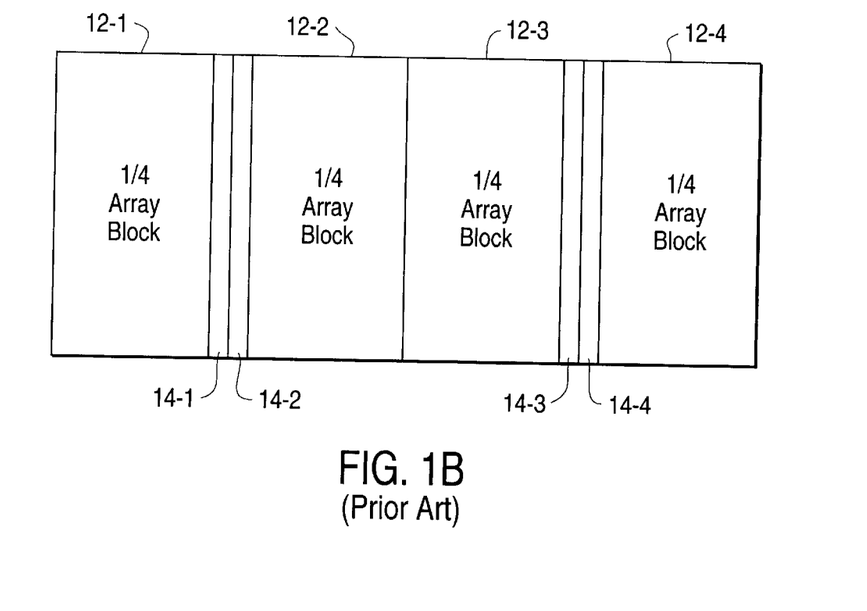

In FIG. 1B, the memory array is divided into four sub-arrays 12-1, 12-2, 12-3, and 12-4 thus reducing the length of each wordline by a factor of four. However, such division of the array requires the duplication of some of the circuit blocks interfacing with the array. For example, four sets of row decoders 14-1, 14-2, and 14-3 are needed as shown. To reduce the bitline length by one half, each sub-array 12-1 through 12-4 would need to be divided into two, with the column decoder block 16 and block 18 (which includes the sense amplifiers and data I/O circuits) being duplicated. Such duplication can result in unnecessary die size increase if not properly implemented. Further, for very high-performance (e.g., high speed, low power), high-density memories wherein a large number of array divisions is used to achieve the speed targets, there may be diminishing returns on the speed after a certain number of array divisions, and there certainly would be a large power penalty associated with every level of array division. This is due to the large amount of duplication of the array-interface circuitry which leads to highly capacitive nodes in speed-sensitive circuit paths. To quickly switch such high-capacitance nodes, large drivers are required which consume substantial dynamic power. This has substantially hindered the cost-effective development of high-speed, low-power, high-density memories for such popular memory applications as portable devices.

The conventional memory configurations of FIGS. 1A and 1B suffer from a number of other drawbacks. First, the address access time is non-uniform across the array depending on both the access path (i.e., row or column) and the physical location of the cell in the array. Typically, the row access path is slower than the column access path because of the presence of the wordline RC delay in the row access path. Also, within the row access path, the cells have different access times depending on the location of the selected cell along the row. For example, the cell located closest to the wordline driver has a faster access time than the cell located furthest from the wordline driver. These non-uniformities in address access time result in complications in both the use of memories as well as their design.

Another drawback is the inefficient use of redundancy. Commonly, redundant blocks of rows and/or columns of cells are added in the array to enable replacement of defective cells with redundant cells. However, often, due to design constraints, a redundant block of rows or columns is used to replace a row or column having only one or few defective cells, thus resulting in inefficient use of the available redundant cells.

Thus, a memory configuration which yields high speed and low power, results in a more efficient use of redundancy, enjoys a relatively uniform address access time for all memory cells, is easily scalable to higher memory densities with minimal speed and power penalties, and is memory-type independent, is desirable.

BRIEF SUMMARY OF THE INVENTION

In accordance with one embodiment of the present invention a semiconductor memory includes a first array block having at least two sub-array blocks and a first interconnect routing channel through which a first group of local interconnect lines extend. Each of the two sub-array blocks includes at least two lower-level sub-array blocks and a second interconnect routing channel through which a second group of local interconnect lines extend. The first group of local interconnect lines are configured to carry input information for accessing memory locations in which to store data or from which to retrieve data. The second group of local interconnect lines are configured to carry a subset of the input information.

In another embodiment, the semiconductor memory further includes a first higher-level array block including at least said first array block and a second substantially similar array block and a third interconnect routing channel through which a third group of local interconnect lines extend. The third group of local interconnect lines are configured to carry a superset of the input information.

In another embodiment, the first group of local interconnect lines extends orthogonally to the second group of local interconnect lines.

In another embodiment, the first interconnect routing channel extends a longer distance than the second interconnect routing channel.

In another embodiment, the first interconnect routing channel is located between the two sub-array blocks, and the second interconnect routing channel in each of the two sub-array blocks is located between the corresponding two lower-level sub-array blocks.

In another embodiment, each lower-level sub-array block comprises a plurality of memory cell array blocks each having a plurality of memory cells arranged along a predesignated number of rows and columns. First and second adjacent memory cell array blocks in each lower-level sub-array block are coupled to a data transfer block configured to selectively transfer data to or from selected ones of the plurality of memory cells in one or both of the first and second adjacent memory cell array blocks.

In another embodiment, each lower-level sub-array block further comprises a plurality of data lines extending over the corresponding memory cell array blocks, the data lines being coupled to the data transfer block so that in a memory access operation data is transferred between the data lines and one or both of the first and second memory cell array blocks via the data transfer block.

In another embodiment, the data transfer block includes a plurality of sense amplifiers and a column multiplexer configured to selectively transfer data from selected ones of the plurality of memory cells in one or both of the first and second adjacent memory cell array blocks to the plurality of sense amplifiers. The plurality of sense amplifiers are coupled between the column multiplexer and the data lines.

In accordance with another embodiment of the present invention, a method of forming a semiconductor memory having a plurality of memory cells includes the following acts. A first array block is formed, which includes at least two first-lower-level (1LL) blocks separated by a first interconnect routing channel through which a first group of local interconnect lines extend. At least two second-lower-level (2LL) blocks are formed in each of the at least two 1LL blocks. The two 2LL blocks are separated by a second interconnect routing channel through which a second group of local interconnect lines extend orthogonally to the first group of interconnect lines. At least two third-lower-level (3LL) blocks is formed in each of the at least two 2LL blocks. The two 3LL blocks are separated by a third interconnect routing channel through which a third group of local interconnect lines extend orthogonally to the second group of interconnect lines. The first group of local interconnect lines are configured to carry input information for accessing one or more of the plurality of memory cells. The second group of local interconnect lines are configured to carry a subset S1 of the input information. The third group of local interconnect lines are configured to carry a subset S2 of the subset S1 of the input information.

In another embodiment, the method further includes forming a first higher-level array block. The first higher-level block includes at least the first array block and a second array block. The second array block is substantially similar to the first array block. The first and second array blocks are separated by a fourth interconnect routing channel through which a fourth group of local interconnect lines extend orthogonally to the third group of local interconnect lines. The fourth group of local interconnect lines are configured to carry a superset of the input information.

In another embodiment, the method further includes forming a plurality of memory cell array blocks in each of the at least two 3LL blocks. Each memory cell array block has a plurality of memory cells arranged along a predesignated number of rows and columns. A first and a second adjacent memory cell array blocks in each of the at least two 3LL blocks are coupled to a data transfer block configured to selectively transfer data to or from selected ones of the plurality of memory cells in one or both of the first and second adjacent memory cell array blocks.

In accordance with yet another embodiment of the present invention, a method of forming a semiconductor memory includes the following acts. A first array block is formed which has a plurality of memory cell array blocks each having a plurality of memory cells arranged along a predesignated number of rows and columns. A first higher-level-1 (HL1) block is formed. The first HL1 block includes at least the first array block and a second array block. The first and second array blocks are substantially similar. The first and second array blocks are separated by a first interconnect routing channel through which a first group of local interconnect lines extend. A first higher-level-2 (HL2) block is formed. The first HL2 includes at least the first HL1 block and a second HL1 block. The second HL2 block being substantially similar to the first HL1 block. The first and second HL1 blocks are separated by a second interconnect routing channel through which a second group of local interconnect lines extend orthogonally to the first group of local interconnect lines. A first higher-level-3 (HL3) block is formed. The first HL3 includes at least the first HL2 block and a second HL2 block. The second HL2 block is substantially similar the first HL2 block. The first and second HL2 blocks are separated by a third interconnect routing channel through which a third group of local interconnect lines extend orthogonally to the second group of local interconnect lines. The third group of local interconnect lines are configured to carry input information for accessing one or more of said plurality of memory cells. The second group of local interconnect lines are configured to carry a subset S1 of the input information. The first group of local interconnect lines are configured to carry a subset S2 of the subset S1 of the input information.

Further features and advantages of the present invention will become more fully apparent form the following detailed description of the invention, the appended claims, and the accompanying drawings.

DETAILED DESCRIPTION OF THE INVENTION

Figure 2A:
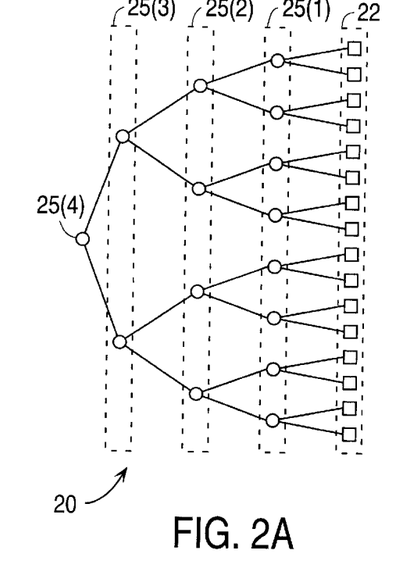
FIG. 2A shows an exemplary memory array drawn schematically as a tree with two-way branching (decoding) in accordance with one embodiment of the present invention.

FIG. 2A shows a memory 20 drawn schematically as a tree to illustrate, among other things, hierarchical decoding used in embodiments of the invention. In this specific example, the tree has 16 memory units (leaves) in a block 22, accessed through four levels of branching (decoding), from a root node 25(4) and three additional levels of branch nodes 25(3), 25(2), and 25(1). The memory units in block 22 are the smallest addressable memory blocks each including one or more memory cells. It is convenient to consider the root node as the highest-numbered level in the hierarchy, with the lower levels having successively lower numbers, with the nodes at the lowest branching level being considered to be level 1. A reverse numbering system may also be used, however, and might seem more natural for some purposes.

The branching is two-way at each node. From a memory access point of view, each node represents a two-way selection, i.e., resolution of a single bit of a four-bit input address. Thus, the nodes represent address decoding, and could equally well be referred to as decoders. At root node 25(4), the resolution of the first address bit determines whether to access the top half or the bottom half of the tree. Similarly, once the first address bit is resolved, the resolution of the second address bit (at the second-level) determines whether to access the top quarter or the bottom quarter of the selected half of the tree. Similarly, the resolution of the third address bit at the third-level determines whether to access the top eighth or the bottom eighth of the selected quarter of the tree. The resolution of the fourth address bit at the fourth-level determines whether to access the top memory unit or the bottom memory unit of the selected eighth of the tree.

Figure 2B:
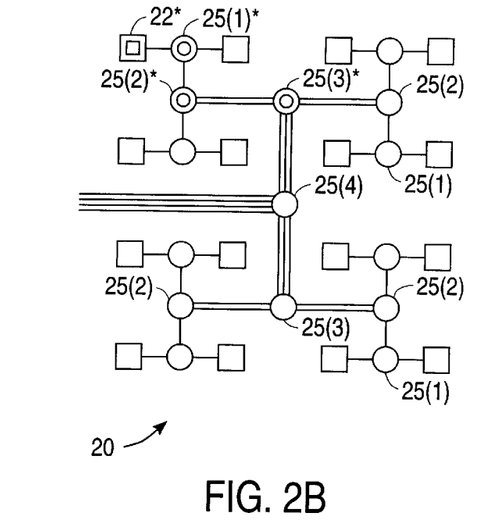
FIG. 2B shows a simplified layout diagram of the FIG. 2A tree in accordance with one embodiment of the present invention.

FIG. 2B shows memory 20 drawn in a way that more closely (but still schematically) represents a layout according to an embodiment of the invention. The same reference numerals are used as in FIG. 2A except as noted below. As can be seen, the block 22 memory units are laid out in an H-tree, with nodes 25(1), 25(2), 25(3), and 25(4) (decoders) interspersed with the memory units. The figure also shows the distribution of the address buses. In particular, a 4-bit address bus is routed to node 25(4), a 3-bit address bus is routed from node 25(4) to each of nodes 25(3), a 2-bit address bus is routed from each of nodes 25(3) to a respective pair of nodes 25(2), and a 1-bit address bus is routed from each of nodes 25(2) to a respective pair of nodes 25(1). This can be thought of conceptually as each node using one of the address bits coming to it and passing the remaining address bits to the nodes at the next level down the tree. Nodes 25(1) provide selection signals to the block 22 memory units.

FIG. 2B also shows the selection of a particular memory unit, designated 22* and shown with a second square inside. This selection occurs as a result of successive decoding by node 25(4), and subsequent decoding by particular ones of nodes 25(3), 25(2), and 25(1), designated 25(3)*, 25(2)*, and 25(1)* and shown with a second circle inside. FIG. 2B illustrates a feature of this invention, namely, all cell units 22 are substantially the same distance away from the root, and thus uniform memory access time is achieved for all cell units.

Figure 3A:
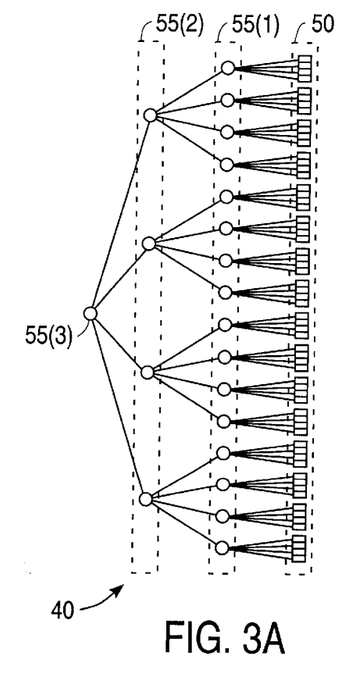
FIG. 3A illustrates an exemplary memory array drawn schematically as a tree with four-way branching (decoding) in accordance with another embodiment of the present invention.
Figure 3B:
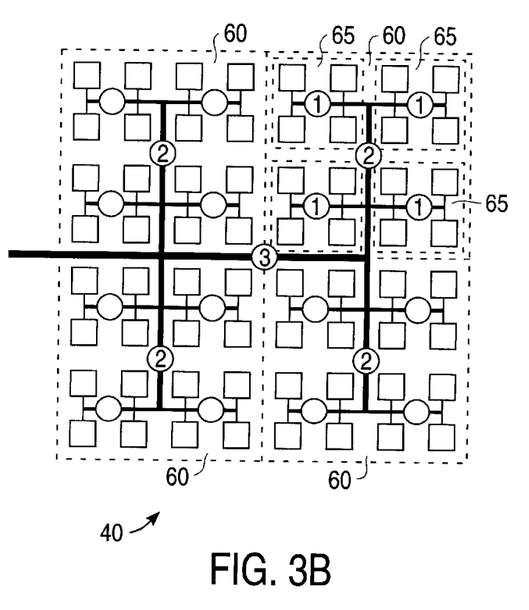
FIG. 3B shows a simplified layout diagram of the FIG. 3A tree in accordance with one embodiment of the present invention.

FIGS. 3A and 3B show tree and layout representations, respectively, of a memory 40. This memory differs from memory 10 in that there are 64 memory units in a block 50 accessed through three levels of branching (decoding), from a root node 55(3) and two additional levels of branch nodes 55(2) and 55(1), and that the branching at each node is four-way rather than two-way. Thus, each node represents a four-way selection, i.e., resolution of two bits of a 6-bit input address.

For simplicity, reference numerals are not used for the nodes in FIG. 3B, but rather root node 55(3) is denoted as a circle with a numeral "3" inside, the four second-level nodes 55(2) are denoted as circles with a numeral "2" inside, and some of first-level nodes 55(1) are denoted as circles with a numeral "1" inside. A 6-bit address bus is routed to the root level node (denoted with numeral "3"). Two bits are decoded to determine which of the four quadrants 60 (denoted by dashed squares) is to be selected, and a 4-bit address bus containing the remaining four bits is routed to each of the four second-level nodes (one in each quadrant). Two bits are decoded to determine which of the four sub-quadrants 65 (denoted by dashed squares in the upper right quadrant) in each quadrant is to be selected, and a 2-bit address bus is routed to each of the first-level nodes. The first-level nodes decode the last two bits to determine which of four memory units is to be selected.

Each of sub-quadrants 65, which contains the first-level node (decoder) and the associated four memory units, can be considered a basic block from which memory 40 is built. In this case, four such blocks make up one of the quadrants, and four quadrants make up the whole array. It will be appreciated that this architecture is scalable. Thus, what is shown as the entire memory can be combined with other such memories to make up a larger memory. Conversely, what are shown as single memory units in block 50 could themselves be basic blocks, quadrants, or the whole array as shown.

Figure 3C:
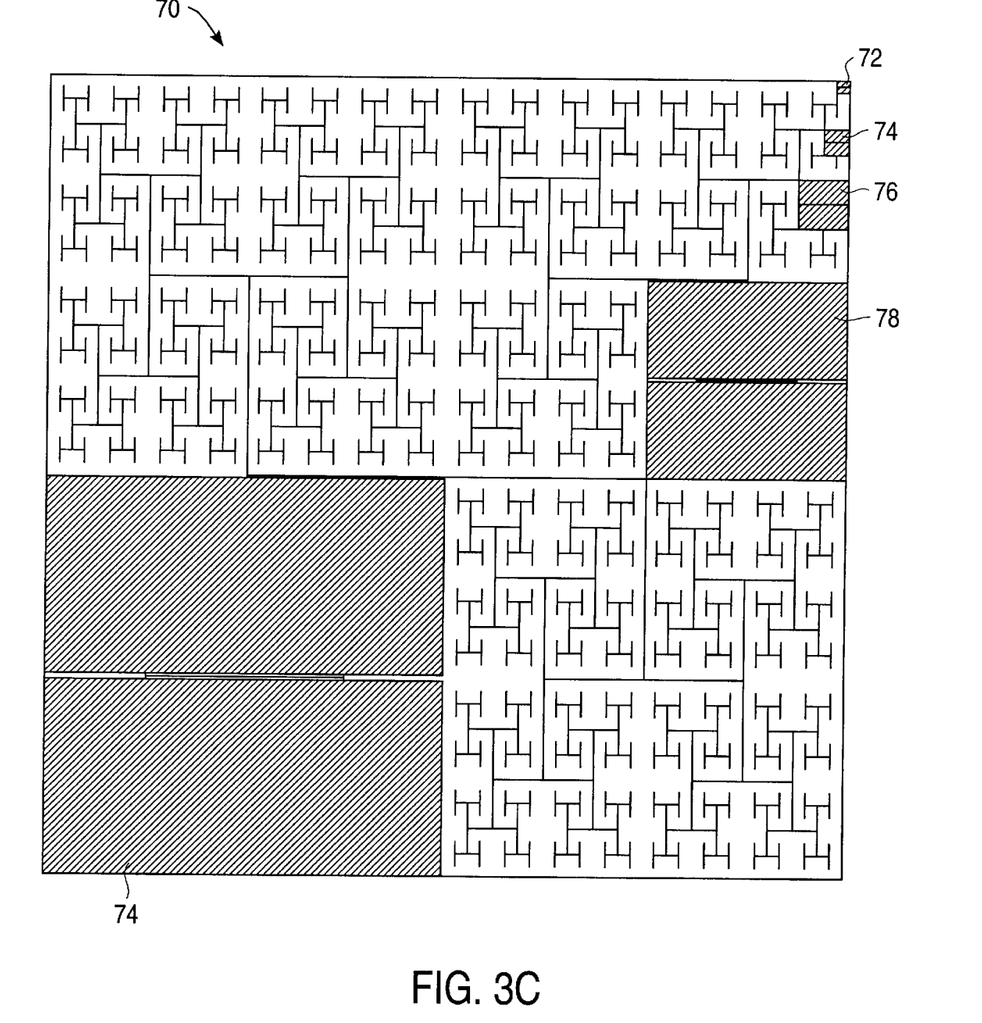
FIG. 3C shows an exemplary layout diagram of a larger memory using an H-tree with four-way branching (decoding)

It will be appreciated that the examples shown in FIGS. 2A and 2B, and in FIGS. 3A and 3B are simple examples. Practical implementations contain significantly more memory units. This can be accomplished by making the tree deeper (more levels) or by increasing the branching at each level, or both. An example of such memory is shown in FIG. 3C. FIG. 3C shows construction of a memory 70 using an H-tree with four-way branching. The basic memory unit is shows by reference numeral 72. Block 74 includes four basic memory units, block 76 includes sixteen basic memory units, block 78 includes 256 basic memory units, and block 79 shows 65,536 basic memory units. It can be seen that once the basic memory unit is constructed, the whole memory can be systematically constructed using an H-tree, or similar tree configurations.

Although FIGS. 2A, 2B, 3A, 3B, and 3C show same-way branching at each level, the branching need not be the same at each level. In fact, depending on the number of address bits required, it may be impossible to have the same degree of branching at each level.

More generally, the tree can be considered to have M levels of branching (decoding), with the root being the Mth level. A given level i (the ith level) can be considered to have m(i)-way branching. Thus, the memory's basic block (a level-1 block) has m(1) memory units, and a level-2 block comprises m(2) level-1 blocks. At the highest level, the array comprises m(M) level-(M-1) blocks.

Figure 4:
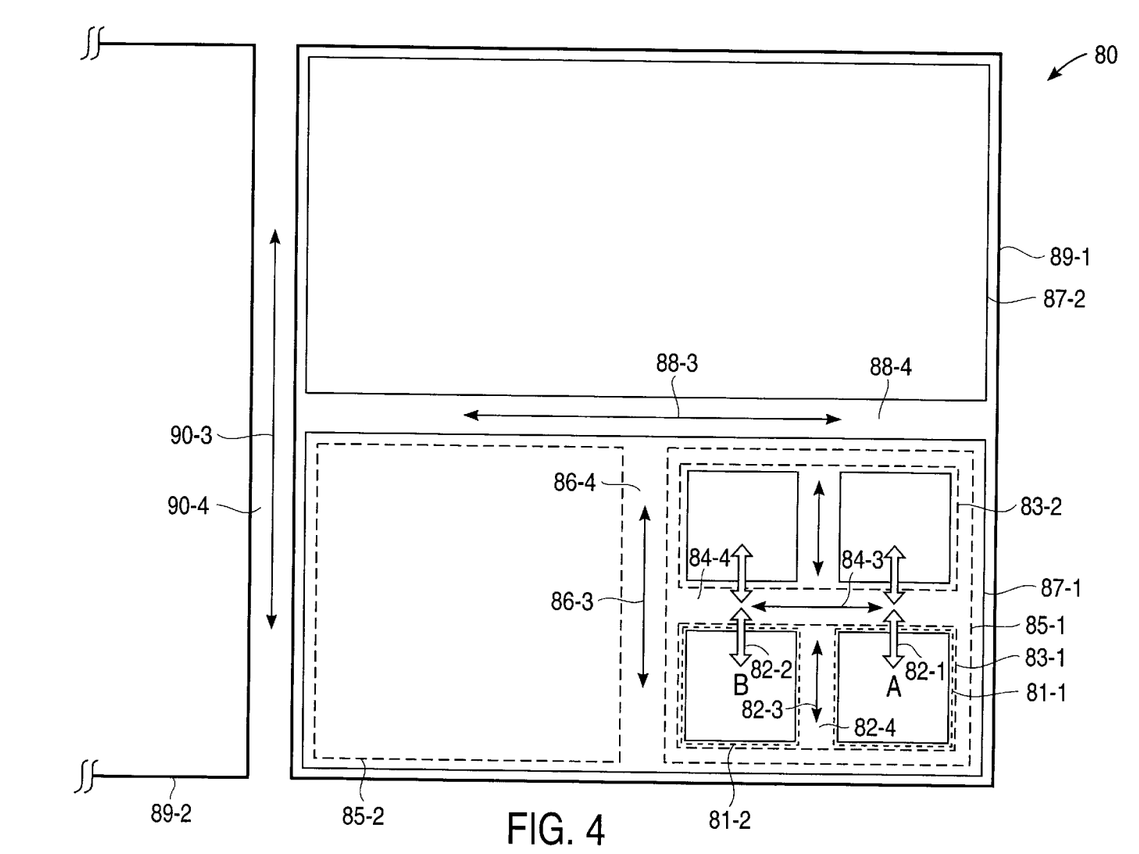
FIG. 4 shows a simplified block diagram floor plan for a memory in accordance with one embodiment of the present invention.

FIG. 4 shows a simplified block diagram for a memory 80 in accordance with one embodiment of this invention. Memory 80 is constructed by placing and interconnecting a plurality of substantially similar sub-blocks (e.g., sub-blocks A, B) in a systematic fashion. Sub-block A includes a predesignated number of rows and columns of memory cells. Sub-block A is coupled to receive decoded address signals from a local bus 82-3 for selecting a predesignated number of memory cells. A corresponding number of bits of data are transferred to (in a write operation) or from (in a read operation) the selected memory cells in sub-block A via a data bus 82-1.

Local bus 82-3 is shown extending vertically through an interconnect routing channel 82-4 between the two sub-blocks A, B. Local bus 82-3 may alternatively be routed through interconnect channels formed on the outside of either of or both sub-blocks A, B, with the orientation of bus 82-3 remaining the same. However, in some embodiments, placing the routing channel between sub-blocks A, B results in a more optimal layout and better memory performance. Sub-block B is a mirror image (about a vertical axis) of sub-block A, receiving decoded address signals from local bus 82-3 and providing data signals (in a read operation) or receiving data signals (in a write operation) via a data bus 82-2. Alternatively, sub-block B may not be a mirror image of sub-block A, but rather a duplicate of sub-block A with the same orientation and layout as sub-block A. However, in some embodiments, placing sub-block B as a mirror image of sub-block A may result in a more optimal layout and a better memory performance.

The bit length of data buses 82-1 and 82-2 depends upon the required bit length of memory 80's IO bus as well as other factors. For example, if the memory IO bus is 32 bits wide (e.g., memory 80 communicates with a 32-bit processor), then sub-block A provides 32 bits of data on data bus 82-1 assuming only one of sub-blocks A, B is selected in each memory access. Alternatively, each of sub-blocks A and B can provide 16 bits of the 32 bits of data on their respective data buses provided that both sub-blocks are selected in a memory access. The structure and operation of sub-blocks A and B and some of their different embodiments are described in more detail further below in reference to FIG. 5.

In FIG. 4, sub-blocks A and B and local bus 82-3 form a first-level block 83-1. A larger second-level block 85-1 is formed by duplicating the first-level block 83-1 to form block 83-2. Duplicate block 83-2 is a mirror image (about a horizontal axis) of the first-level block 83-1. As shown, duplicate block 83-2 and first-level block 83-1 are separated to form an interconnect routing channel 84-4 between them. A local bus 84-3 is shown extending through routing channel 84-4 along the horizontal dimension. Local bus 84-3 carries address signals, decoded address signals, as well as data signals to be provided to or received from blocks 83-1 and 83-2. Routing channel 84-4 also includes decoding circuit (not shown) for resolving a sufficient number of address bits to select one of blocks 83-1 and 83-2. Thus, local bus 82-3 in first-level block 83-1 carries a subset of the address bits that local bus 84-3 carries, and is perpendicular to local bus 84-3.

A larger third-level block 87-1 is formed by duplicating the second-level block 85-1 to form a duplicate block 85-2. Duplicate block 85-2 is a mirror image (about a vertical axis) of the second-level block 85-1. As shown, duplicate block 85-2 and second-level block 85-1 are separated to form an interconnect routing channel 86-4 between them. A local bus 86-3 is shown extending through routing channel 86-4 along the vertical dimension. Local bus 86-3 carries address signals, decoded address signals, as well as data signals to be provided to or received from blocks 85-1 and 85-2. Routing channel 86-4 also includes decoding circuit (not shown) for resolving a sufficient number of address bits to select one of blocks 85-1 and 85-2. Thus, local bus 84-3 carries a subset of the address bits that local bus 86-3 carries, and is perpendicular to local bus 86-3.

An even larger fourth-level block 89-1 is formed in a similar manner to the previous blocks, i.e., by duplicating third-level block 87-1 to form its mirror image duplicate block 87-2, and separating them to form an interconnect routing channel 88-4 between them. This block has all the attributes of previous blocks, namely, a local bus 88-3 which extends horizontally through interconnect channel 88-4 and carries data signals, decoded address signals, as well as address bits which form a superset of the address bits carried by local bus 86-3. Interconnect channel 88-4 also includes decoding circuit (not shown) for selecting one of blocks 87-1 and 87-2.

As can be seen from the above description, a systematic approach is used in constructing memory 80. For a given size of sub-block A, the block-duplication technique as described above can be carried out as many times as necessary to obtain the desired memory density. Based on the desired density and memory performance (e.g., speed and power), the bit length of the memory IO bus, as well as other factors, a particular size sub-block A is formed. For example, in the case of a high density memory, sub-block A can be made large in order to minimize the number of level blocks, thus minimizing the routing overhead. Also, buffering techniques can be used to buffer signals traveling longer distances through the level blocks. In one embodiment, address decoding circuitry is optimally placed along the interconnect routing channels to also provide signal buffering, thus improving speed and die size.

Another feature of this invention is that each level block may be expanded to include a larger number of sub-blocks to accommodate the desired address decoding (e.g., four-way, 16-way, etc.) at each level. For example, second-level block 85-1 can be expanded from a four-way decoding to an 8-way decoding by duplicating each of its sub-blocks 83-1 and 83-2 once. Proper address decoding needs to be provided at the proper level blocks to accommodate the expansions. Each level block can be expanded independently of the other level blocks. A limitation on the expansion however, is that each level block can be expanded only along the dimension parallel to its local bus. In the above example of expanding the second-level block 85-1, the duplicates of sub-blocks 83-1, 83-2 are placed along the horizontal dimension parallel to local bus 84-3. An example of 16-way decoding is shown in FIG. 5 and described in detail further below.

In FIG. 4, similar to FIGS. 2B and 3B, the local buses include a larger number of and wider interconnect lines at the root or top level block (e.g., local bus 90-3 in FIG. 4) and reduce in number and width as decode signals drop off and address bits are resolved at each lower level block. Wider interconnect lines at the root level are preferred in order to minimize the resistance of wires that extend longer distances. At lower level blocks, due to smaller distances, the widths of wires can be reduced, thus resulting in finer routing and saving space.

As described above, memory 80 can be constructed starting with the smallest memory block and expanding up, i.e., by systematically building multiple blocks at each higher-level block. Alternatively, memory 80 can be constructed starting at the top-level block and segmenting the memory into multiple sub-blocks at each lower-level block.

Figure 5:
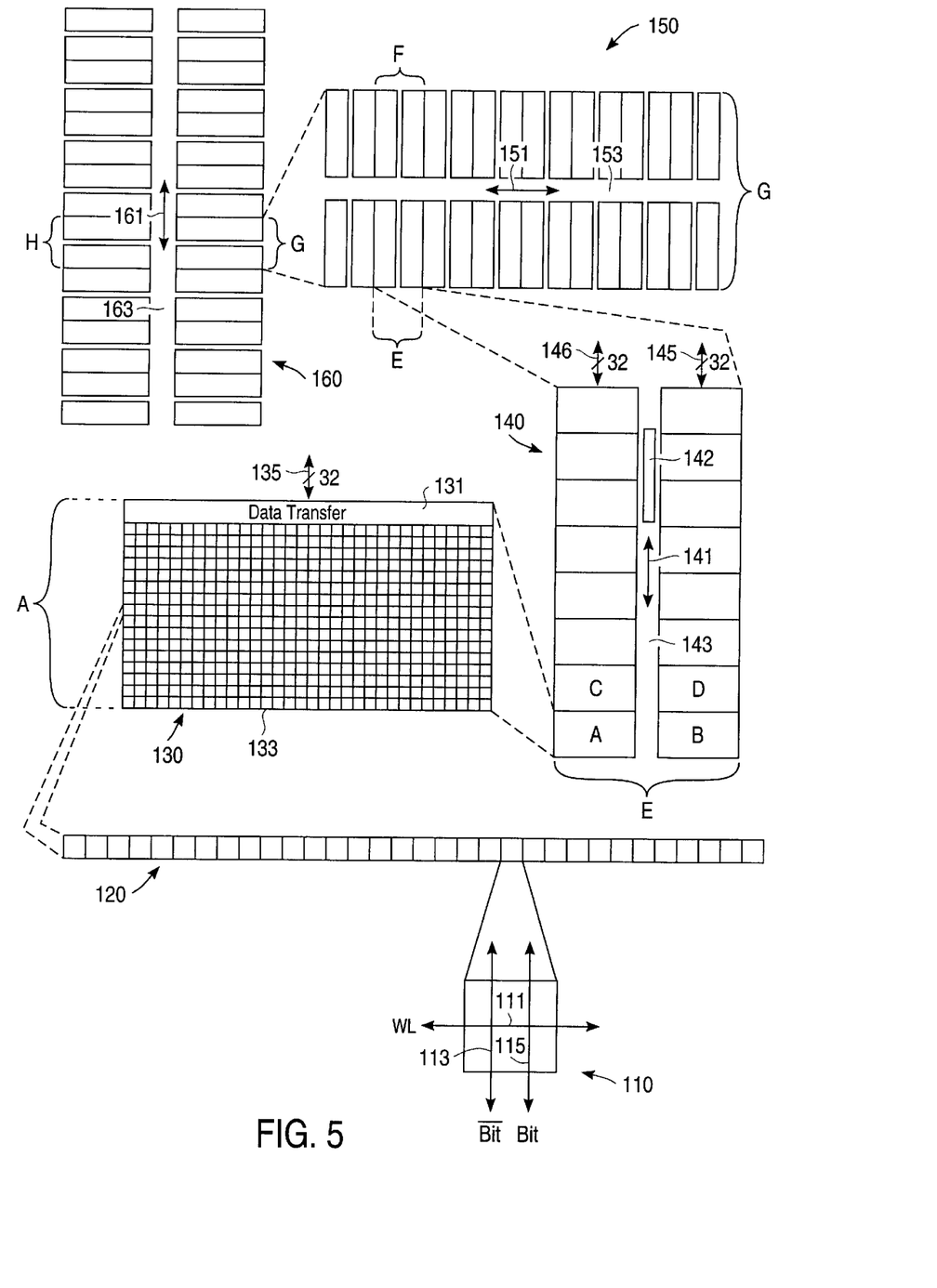
FIG. 5 shows the structural details of a memory as well as the method by which the memory is constructed, in accordance with one embodiment of the present invention.

FIG. 5 shows the structural details of a more realistic memory 160, as well as the method by which memory 160 is constructed. Memory 160 however is merely an example of one of many possible ways of constructing a memory in accordance with this invention. Memory 160 is constructed using four levels of decoding with 16-way branching at each level. That is, the bit length of the address is 16 bits, and each level resolves four of the address bits. The smallest amount of memory addressable with the 16 address bits is the memory unit shown as block 120 which includes 32 cells (data bits). The memory 160 configuration is thus 64K by 32 bits. The invention is not limited to 32-bit addressable memory units. The smallest addressable unit may be smaller than the 32-bit block 120, e.g., 16 bits, or larger than the 32-bit block 120, e.g., 64 bits.

In FIG. 5, a sub-block repeated in each level block is magnified to show its sub-blocks and other details. Sub-block G of memory 160 is magnified as block 150, sub-block E of block 150 is magnified as block 140, sub-block A of block 140 is magnified as block 130, an addressable unit of block 130 is magnified as a row block 120, and one of the memory cells in row block 120 is magnified as cell block 110. The construction and operation of memory 160 will be described starting with cell block 110.

Cell block 110 is a single memory cell schematically shown to have a terminal 111 coupled to a wordline WL commonly shared by all the cells in the row block 120. Cell block 110 has two additional terminals 113 and 115 respectively coupled to each of a bitline pair Bit and $\overline{\text{Bit}}$ extending along a column of cells in block 130. Cell block 110 may contain any type of semiconductor memory cell such as a volatile memory cell (e.g., SRAM cell, DRAM cell) or a nonvolatile memory cell (e.g., ROM cell, EPROM cell, EEPROM cell, Flash EPROM cell). Although cell block 110 is shown to have a specific number of terminals commonly used in some of the above-identified memory cell types (e.g., in DRAMs and SRAMs), it is not intended to be limited as such. For example, one skilled in this art can modify cell block 110 to eliminate terminal 113 and bitline $\overline{\text{Bit}}$ to which it is coupled, and add a terminal for connection to an erase line EL extending along the columns or wordlines to implement a Flash EPROM memory cell. Other types of memory cells and configurations can be implemented by one skilled in this art.

Row block 120 has 32 cell blocks 110, and forms one of 16 rows in array section 133 of block 130. Block 130 also includes a data transfer section 131. In one embodiment, there are 32 pairs of pass transistors (not shown) in section 131, one pair for each column of cells. Each pair of pass transistors functions as a switch between one of the 32 bitline pairs Bit and $\overline{\text{Bit}}$ and a data bus 135. The gates of the pass transistor pairs may be connected together to form a control line (not shown) for controlling the transfer of 32 bits of data between a selected row in array section 133 and data bus 135. Alternatively, the gates of the pass transistor pairs may be grouped (i.e., decoded) to form a number of control lines, for transferring less than 32 bits of data between array section 133 and data bus 135. In that case, bus 135 would have a bit width less than the 32 bits shown in FIG. 5. In FIG. 5, the bitlines extend along the vertical dimension, and the wordlines and pass transistor control lines extend along the horizontal dimension.

In another embodiment, section 131 includes 32 sense amplifiers each being coupled to receive a pair of Bit and $\overline{\text{Bit}}$ lines and providing one of the 32 data lines of data bus 135. In this embodiment, no preselection of bitlines occurs. In another embodiment, section 131 includes a column multiplexer combined with sense amplifiers to perform column selection and sensing. In this embodiment, fewer than the 32 cells in a selected row may be selected in a memory access operation. For example, in the case where the bit length of data bus 135 is 16 bits, 32 pairs of pass transistors selectively couple 16 of the 32 pairs of Bit and $\overline{\text{Bit}}$ lines to the inputs of the 16 sense amplifiers. Thus, the 32 pairs of pass transistors perform a two-to-one selection such that only half the data bits along the selected row are transferred to the 16 sense amplifiers. Depending on the desired bit length of the data, memory density, performance criteria, and other factors, other column muxing and sensing configurations can be implemented by one skilled in this art.

In the next level up, block 140 includes 16 sub-blocks. In one embodiment, each of the 16 sub-blocks has a structure similar to block 130. The sub-blocks are arranged in two columns of eight sub-blocks each, with an interconnect routing channel 143 formed between the two columns of sub-blocks. The sub-block labeled as "A" corresponds to block 130 described above. Sub-block B is a mirror image (about a vertical axis) of sub-block A, and sub-blocks C, D are mirror images (about a horizontal axis) of sub-blocks A, B, respectively. Sub-blocks A and B or C and D need not be mirror images of one another, and may be oriented similarly. However, by placing them in a mirror image configuration, some circuits such as sense amplifiers may be shared by two adjacent sub-blocks rather than duplicated for each, thus reducing die size and power consumption.

Routing channel 143 includes a local bus 141 for carrying address signals, decoded address signals, control signals, and decoding circuit block 142 for resolving a sufficient number of address bits to select one or more of the 16 sub-blocks. The physical location and size of decoding circuit block 142 is not limited to that shown in FIG. 5. Depending on layout, performance, and other considerations, decoding circuit block 142 may be spread out throughout routing channel 143. The control lines coupled to the column multiplexers and the wordlines in the 16 sub-blocks are driven from the center of block 140, i.e., the routing channel region 143. A 32-bit data bus 145 extends over the right column of sub-blocks and can be electrically coupled to one or more selected bitlines in one or more selected sub-blocks. Another 32-bit data bus 146 extends over the left column of sub-blocks and can be electrically coupled to one or more selected bitlines in one or more selected sub-blocks.

The layout implementation of Block 140 requires a number of metal layers depending on the cell technology used, the specific memory configuration, the design goals, and other factors. Following is merely an example of how the different layers of metal (e.g., aluminum or copper) provided by conventional multi-layer processes may be used in the implementation of block 140, and is not intended to limit this invention. In this example, four metal layers are used. Depending on the requirements of the cell technology used, a first metal layer may be used within each memory cell to make the required electrical connections. A second metal layer may be used to form the bitlines extending vertically across each sub-block. A third metal layer may be used to strap the wordlines, i.e., the third metal layer makes electrical contact to at least an end of each wordline furthest from the wordline driver. A fourth metal layer may be used to form data buses 145 and 146 extending over the corresponding column of sub-blocks.

An optional fifth metal layer may be used to allow interconnect bus 141 to be expanded over a portion of the two columns of sub-blocks. This helps reduce the width of routing channel 143, and thus result in die size savings. This technique (over-the-cell routing) may also be used in one or more of the higher-level blocks 150 and 160 to reduce the width of the corresponding routing channels without requiring any additional layers of metal.

The operation of block 140 is described next. One or more of the sub-blocks in block 140 is selected via decoded control lines driving the column multiplexer of each sub-block. Within the selected one or more sub-blocks, one of the 16 rows is selected via row select decoding signals generated by row decoders (not shown). Thirty-two cells along the selected row in each of the one or more selected sub-blocks are thus coupled to a corresponding data bus 145 and/or 146. The row decoders and decoding circuit generating the decoded control lines may be placed in routing channel 143 or at the higher-level block 150.

Many decoding combinations between the row decoding and control line decoding is possible in selecting the desired number of data bits from block 140. For example, if block 140 is to provide 64 bits of data, a row decoding whereby one row in each of the sub-blocks is selected may be combined with a control line decoding whereby two of the 16 sub-blocks (one from each column of sub-blocks) are selected. Alternatively, of the 64 bits provided by block 140, fewer data bits (e.g., 32 bits) can be selected in block 150 by properly decoding the address signals.

Following are a few examples of how block 140 can be configured to obtain the desired memory configuration. The wordline and control line decoding circuit required to implement these configurations is straightforward to one skilled in the art given the above description, and thus will not be described.

In one example, memory 160 has a 64-bit IO bus and thus an 8-way decoding would be proper for block 140 so that block 140 provides 64 bits of data on data buses 145 and 147. In the case of a 32-bit memory IO bus, an 8-way decoding may be implemented, but a further decoding (carried out at, for example, the higher level block 150) is required to select 32 of the 64 bits of data on buses 145 and 147. Alternatively, in the case of a 32-bit memory IO bus, the corresponding data lines in the two data buses 145 and 146 may be connected together to form a single 32-bit data bus, and a 16-way decoding may be implemented whereby only one of the 16 sub-blocks is selected from block 140. In the case of a memory IO bus having fewer than 32 bits, a decoding of the control lines driving the column mux of each sub-block may be implemented as described earlier to select fewer than 32 cells in correspondence with the bit width of the IO bus. Alternatively, the sub-blocks may be reconfigured so that each row includes fewer than 32 cells in correspondence with the bit width of the IO bus. In the embodiment where 16 bits of data are to be transferred via each of data buses 145, 146, every other cell on a selected row within a selected sub-block (e.g., sub-block A) may be selected. Such selection of every other cell in a row minimizes coupling effects and cross-talk between adjacent cells and bitlines.

Figure 6:
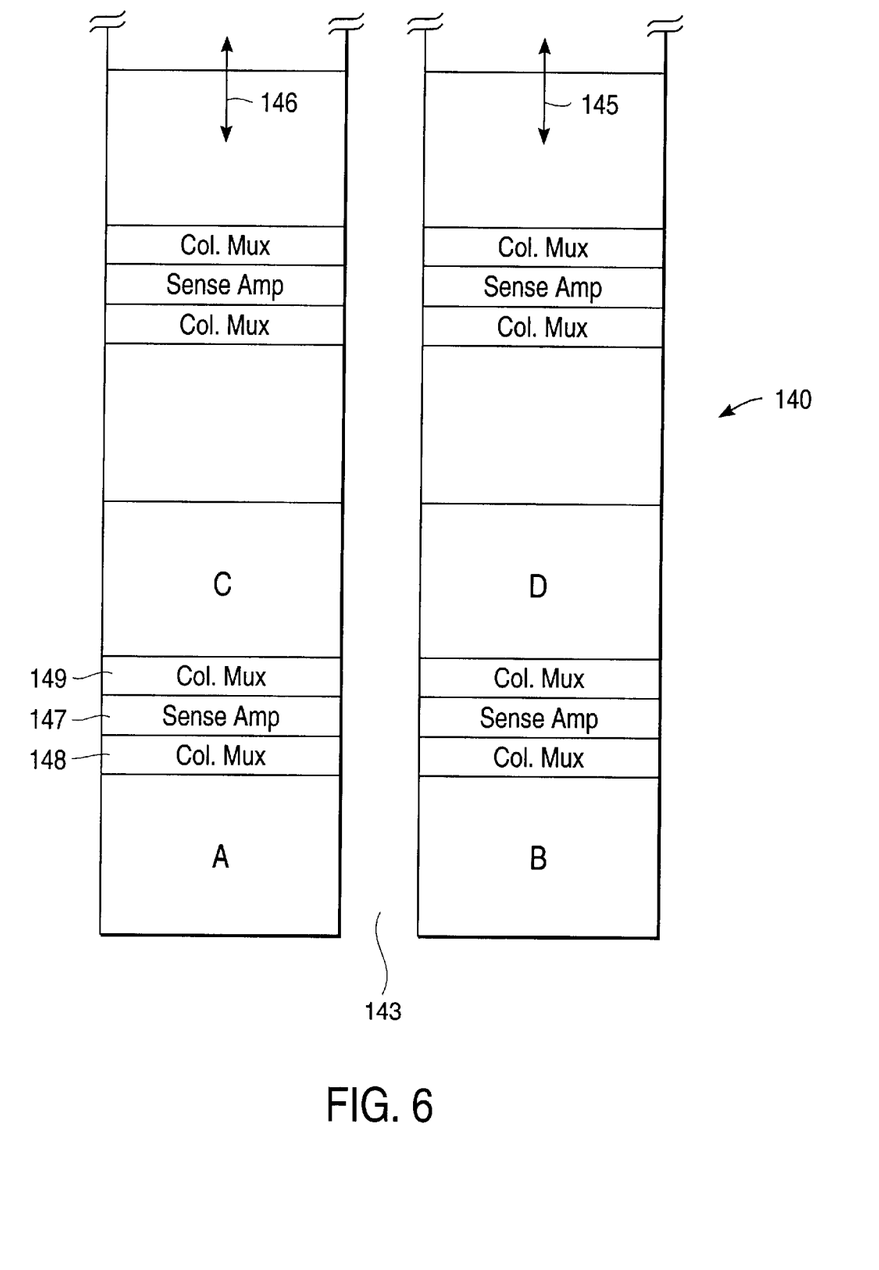
FIG. 6 shows details of a portion of block 140 of FIG. 5 in accordance with one embodiment of the present invention.

In one embodiment, every two vertically adjacent sub-blocks share a row of sense amplifiers. This is illustrated more clearly in FIG. 6 wherein a portion of block 140 is shown in more detail. Sub-blocks A and C share a row of sense amplifiers 147, each sense amplifier being connectable to a pair of Bit and $\overline{Bit}$ lines in sub-block A through column mux 148 and to a pair of Bit and $\overline{Bit}$ lines in sub-block C through column mux 149. An output of each sense amplifier is coupled to one of the data lines of data bus 146. In a read operation, column muxes 148 and 149 function to selectively couple bitlines in one of the two sub-blocks A, C to the inputs of sense amplifiers in section 147.

In another embodiment, block 140 of FIG. 5 includes only sub-blocks A and B so that the entire block 140 has only one row of data transfer block 131. This improves the die size by eliminating the multiple rows of data transfer blocks. In this embodiment, a larger number of rows and columns of cells may be used in each sub-block.

Block 140, also labeled as E, is used as a sub-block in constructing the next higher-level block 150. Sixteen such sub-blocks are placed along two rows so that an interconnect routing channel 153 is formed between the two rows. Each of the sub-blocks in the top row (e.g., sub-block F) is a mirror image of a corresponding sub-block in the bottom row (e.g., sub-block E). A local bus 151 is shown extending through routing channel 153 along the horizontal dimension. Local bus 151 includes interconnect lines for carrying address signals, decoded address signals, and data signals. Routing channel 153 also includes a decoding circuit (not shown) for resolving a sufficient number of address bits to select one or more of the 16 sub-blocks. Thus, local bus 151 carries a superset of the address bits that local bus 141 in each of its sub-blocks carry. Also, local bus 151 extends orthogonally to local bus 141, as shown.

In the embodiment wherein sense amplifiers are shared by two vertically adjacent sub-blocks in block 140 (e.g., as in FIG. 6), a corresponding data line in each of data buses 145, 146 of each of the 16 sub-blocks in block 150 are connected together thus forming a 64-bit wide data bus extending through the routing channel 153. In this embodiment, in a read operation, only one of the sixteen sets of data buses 145, 146 is driven (e.g., by the corresponding sense amplifiers or other driver circuits), while the other fifteen sets of data buses 145, 146 remain undriven (e.g., the sense amplifiers or other circuitry driving the corresponding data buses remain in tristate). One or more address bits may be used to decode the 64-bit wide data bus down to 32 bits, 16 bits, or less depending on the desired memory data I/O bit length. The decoder circuit for decoding the 64-bit wide data bus may be located partially or entirely in routing channel 153 or in the routing channel 163 of the higher level block 160.

In one embodiment wherein no sense amplifiers are used in block 140, a set of sense amplifiers (not shown) coupled to receive cell data via data buses 145 and 146 of each sub-block are placed in routing channel 153. Each sense amplifier receives a pair of signals corresponding to signals on bitlines Bit and $\overline{Bit}$, and provides an amplified data signal. The sense amplifiers or their outputs may be decoded in any number of ways depending on the memory configuration and the design goals. A set of data-in buffer circuits may be incorporated in routing channel 153 in a similar manner to the sense amplifiers to accommodate transfer of programming data to the memory cells.

Block 150, also labeled as G, is used as a sub-block in constructing the next higher level block (the full memory) 160. Sixteen such sub-blocks are placed along two columns so that an interconnect routing channel 163 is formed between the two columns. A local bus 161 is shown extending through routing channel 163 along the vertical dimension. Each of the sub-blocks in the left column (e.g., sub-block H) is a mirror image of a corresponding sub-block in the right column (e.g., sub-block G). Local bus 161 includes interconnect lines for carrying address signals, decoded address signals, and data signals. Interconnect channel 163 also includes a decoding circuit (not shown) for resolving a sufficient number of address bits to select one or more of the 16 sub-blocks. Thus, local bus 161 carries a superset of the address bits that each local bus 151 in the sub-blocks carry. Also, local bus 161 extends orthogonally to local bus 151, as shown.

As can be seen, constructing blocks 150 and 160 from corresponding sub-blocks is substantially similar to constructing the different level blocks illustrated in FIG. 4.

Note that even though each of blocks 160, 150, and 140 are shown as having 16 sub-blocks, the address decoding at each block level may be different. For example, it may be advantageous to perform an 8-way address decoding at block level 140 but a 16-way decoding at block level 150. Also, different block levels may include a different number of sub-blocks and thus a different address decoding. Further, the three types of signals, i.e., address signals, data-in signals, and data-out signals, may be decoded independent of one another. For example, a 16-way decoding of the address signals may be implemented at each block level in selecting the one or more sub-blocks in the lowest level block; a combination of 8-way and 16-way decoding may be implemented at each block level in steering the data-out signals up to block level 160 from the selected one or more of sub-blocks in the lowest level block; and another combination of 8-way and 16-way decoding may be implemented at each block level in steering the data-in signals down to the selected one or more of sub-blocks in the lowest level block.

Address, data, and control pads may be placed around memory 160 and connected to the corresponding interconnect lines in bus 161 through the top or bottom of routing channel 163. A stand-alone memory device is thus constructed. Alternatively, memory 160 may be embedded in a larger system and interconnected to communicate with other blocks in the system through routing channel 163.

Note that because of the highly partitioned array configuration of the present invention, the bitlines and wordlines in every memory cell array block (e.g., block 130 in FIG. 5) have much shorter length than would be the case using conventional approaches. This helps achieve a substantially faster read and write access times than conventional high speed memory devices. Also, since in any memory access only one (or at most few) memory cell array block(s) similar to block 130 is (are) activated, substantial power savings are achieved. Further, because of the substantially small array size of each block 130, substantially small drivers can be used in the read or write path without compromising speed thereby further reducing the overall power consumption.

An important characteristic of the memory configuration of the present invention is that, for example in FIG. 5, every cell array block 130 in the top level block 160 is physically about the same distance (from a routing stand point) away from the center of the routing channel 163. This results in substantially uniform access time regardless of the location of the selected cell array block. This holds true for any density memory.

In another embodiment of the present invention, memory 160 is configured so that in a memory access rather than selecting one or more sub-blocks 130 from the same selected block 140, one or more sub-blocks 130 are selected from two or more selected sub-blocks 140. In one embodiment wherein the 16 sub-blocks in block 160 are divided into 4 quadrants (i.e., top right, top left, bottom right, and bottom left quadrants), an address decoding is implemented at each block level so that one sub-block 130 is selected from each of the four quadrants of block 160. Accordingly, in a memory operation, instead of all data bits being retrieved from or transferred to same sub-block 130, one-fourth of the data bits are retrieved from or transferred to each of four sub-blocks 130. This implementation results in shorter data paths and simpler layout solutions, thus yielding a faster memory access time. This implementation is particularly advantageous in memory applications where a large I/O data bit length (e.g., 256 bits) is required.

Note that in FIG. 5, because of the particular decoding arrangement at each level (i.e., 16-way decoding), the length of the routing channels decrease from the top level block to lower level blocks. For example, the length of routing channel 163 in block 160 is clearly longer than the length of the routing channel 153 in block 150. Although this may be the case with higher level blocks, the opposite may be the case at lower level blocks. For example, in one embodiment it may be desirable to construct block 150 so that it consists of only sub-blocks E and F (i.e., two-way decoding is implemented at block 150), while block 140 remains the same. This configuration results in routing channel 143 of the lower level block 140 being longer than the routing channel 153 of the higher level block 150.

Because of the small size of the basic memory cell array block (e.g., sub-block A), and the systematic grouping of such sub-blocks, a highly efficient redundancy scheme can be implemented. In a first approach, redundancy is implemented at one or more of the block levels by merely including one or more redundant sub-blocks in the given block. A redundant sub-block would be identical to any other sub-block in a block level. Upon identifying one or more defective cells in a sub-block (e.g., sub-block A in block 140), a redundant sub-block can be used to replace the sub-block with defective cells. Alternatively, the rows and/or columns in the redundant sub-block can be decoded so that one or more rows and/or columns can be selected from the redundant sub-block to replace a corresponding one or more rows and/or columns having defective cells.

In a second approach, redundant rows and/or columns of cells can be included in one of the sub-blocks, e.g., sub-block A, in block 140, so that any defective cells in block 140 can be locally replaced with a redundant row and/or column. Alternatively, redundant rows and/or columns of cells can be included in each sub-block of block 140 so that a defective row and/or column in a sub-block can be replaced with a redundant row and/or column from the same sub-block.

The first redundancy approach results in less of a die size penalty than the second approach, but is less efficient than the second approach in terms of the number of redundant cells that are potentially wasted in replacing defective cells. In either approach, far fewer number of redundant cells are wasted in comparison to conventional memories. The circuits needed to implement redundancy can be placed in the routing channels throughout the different block levels.

In another embodiment, redundancy can be implemented at the higher level blocks, e.g., block 160. Several blocks of type 130 or 140 (FIG. 5) can be used as redundant blocks and can be located at higher levels (e.g., at level 160) within the corresponding routing channel (e.g., routing channel 163) or on the boundary of the corresponding block. Such redundant blocks may require additional logic circuit, such as address matching registers that store addresses of defective blocks, in order to enable writing data to and reading data from redundant blocks. This technique advantageously eliminates the die size penalty associated with duplication of redundant blocks as described in first and second redundant approaches. further, due to a small size of redundant memory block (e.g., block 130), a larger number (e.g., 16, 32, or more) of such redundant blocks can be used, thus providing redundancy coverage for large number of defective cells while consuming a small amount of die area. In one embodiment, the redundant block includes sense amplifiers and muxing circuitry, thus allowing replacing defective sense amplifiers and column muxes in addition to defective cells.

In conclusion, the memory configuration, in accordance with the present invention, enables efficient and systematic division of the memory array into a large number of smaller memory arrays. This helps substantially reduce the wordline and bitline lengths, thus requiring smaller drivers. The combination of small wordline/bitline lengths and small drivers, as well as other features of the invention, help achieve high speed and low power. Using a predefined tree configuration, such as an H-tree, results in all the basic memory array blocks being located the same distance away from the root (e.g., center of the memory). Accordingly, a relatively uniform address access time across the whole memory is achieved. More efficient redundancy implementations are made possible by the large number of memory array segmentations. The systematic construction of the memory using a predefine tree arrangement, such as the H-tree, enables scaling the memory to higher or lower densities quite easily with relatively minimal speed and power degradation. The memory configuration of the present invention is memory-type independent, and can be modified to implement any type of semiconductor memory.

The above description is illustrative and not restrictive. For example, the invention is not limited to memory configurations with IO pins, and may be modified to have separate data-in and data-out pins and corresponding circuitries as is well known in this art. The scope of the invention should, therefore, be determined not with reference to the above description, but instead with reference to the appended claims along with their full scope of equivalents.

What is claimed is:

1. A semiconductor memory comprising:
   a first array block having at least two sub-array blocks and a first interconnect routing channel through which a first group of local interconnect lines extend, each of the two sub-array blocks comprising at least two lower-level sub-array blocks and a second interconnect routing channel through which a second group of local interconnect lines extend, the first group of local interconnect lines being configured to carry input information for accessing memory locations in which to store data or from which to retrieve data, and the second group of local interconnect lines being configured to carry a subset of the input information, wherein the first group of local interconnect lines extends orthogonally to the second group of local interconnect lines.

2. The memory of claim 1 further comprising a first higher-level array block, the first higher-level array block comprising:
   at least a second array block and said first array block, said second array block being substantially similar to said first array block; and
   a third interconnect routing channel through which a third group of local interconnect lines extend, the third group of local interconnect lines being configured to carry a superset of the input information.

3. The memory of claim 1 wherein the first group of local interconnect lines extends orthogonally to the second group of local interconnect lines.

4. The memory of claim 1 wherein the first interconnect routing channel extends a longer distance than the second interconnect routing channel.

5. The memory of claim 1 further comprising a first decoding circuit configured to resolve address bits sufficient to select one of the at least two sub-array blocks, and a second decoding circuitry configured to resolve a remaining subset of the address bits sufficient to select one of the at least two lower-level sub-array blocks in the selected one of the at least two sub-array blocks, the selected one of the at least two lower-level sub-array blocks comprising memory locations corresponding to the address bits.

6. The memory of claim 5 wherein the first group of local interconnect lines are configured to carry at least the address bits, and the second group of local interconnect lines are configured to carry at least the remaining subset of the address bits and one or more of decoded signals provided by the first decoding circuit.

7. The memory of claim 5 wherein:
   the first interconnect routing channel includes the first decoding circuit; and
   the second interconnect routing channel in each of the two sub-array blocks includes the corresponding second decoding circuit.

8. The memory of claim 5 wherein the first interconnect routing channel includes the first decoding circuit and a portion or all of the second decoding circuit for each of the two sub-array blocks.

9. The memory of claim 1 wherein:
   the first interconnect routing channel is located between the two sub-array blocks; and
   the second interconnect routing channel in each of the two sub-array blocks is located between the corresponding two lower-level sub-array blocks.

10. The memory of claim 9 wherein the first group of local interconnect lines are from a metal layer such that a number of the interconnect lines in the first group of local interconnect lines are routed over a portion of each of the two sub-array blocks.

11. The memory of claim 9 wherein the second group of local interconnect lines in each of the two sub-array blocks are from a metal layer such that a number of the interconnect lines in the second group of local interconnect lines are routed over a portion of each of the corresponding two lower-level sub-array blocks.

12. The memory of claim 1 wherein:
   each lower-level sub-array block comprises a plurality of memory cell array blocks, each memory cell array block having a plurality of memory cells arranged along a predesignated number of rows and columns; and
   first and second adjacent memory cell array blocks are coupled to a data transfer block configured to selectively transfer data to or from selected ones of the plurality of memory cells in one or both of the first and second adjacent memory cell array blocks.

13. The memory of claim 12 wherein each lower-level sub-array block further comprises a plurality of data lines extending over the corresponding memory cell array blocks, the data lines being coupled to the data transfer block so that in a memory access operation data is transferred between the data lines and one or both of the first and second memory cell array blocks via the data transfer block.

14. The memory of claim 13 wherein the data transfer block comprises:
   a plurality of sense amplifiers; and
   a column multiplexer configured to selectively transfer data from selected ones of the plurality of memory cells in one or both of the first and second adjacent memory cell array blocks to the plurality of sense amplifiers,
   wherein the plurality of sense amplifiers are coupled between the column multiplexer and the data lines.

15. The memory of claim 12 wherein every two adjacent memory cell array blocks in each lower-level sub-array block are constructed in a mirror image fashion.

16. The memory of claim 12 wherein each lower-level sub-array block includes at least one redundant memory cell array block.

17. The memory of claim 16 wherein the at least one redundant memory cell array block is configured so that a memory cell array block of a lower-level sub-array block having one or more defective cells can be replaced with the corresponding redundant memory cell array block.

18. The memory of claim 16 wherein the at least one redundant memory cell array block is configured so that a defective row or column in a memory cell array block of a lower-level sub-array block can be replaced with a row or column of the corresponding redundant cell array block.

19. The memory of claim 12 wherein at least one of the memory cell array blocks in each of the lower-level sub-array blocks includes one or more redundant rows and/or columns of cells.

20. The memory of claim 19 wherein the one or more redundant rows and/or columns of cells in the at least one of the memory cell array blocks are configured so that a defective row or column of cells in any one of the memory cell array blocks of a lower-level sub-array block can be replaced with a redundant row or column of the corresponding at least one of the memory cell array blocks.

21. The memory of claim 12 wherein:
   each of the memory cell array blocks in each of the lower-level sub-array blocks includes one or more redundant rows and/or columns of cells; and
   the one or more redundant rows and/or columns of cells in each memory cell array block are configured so that a defective row or column of cells in a first memory cell array block of a lower-level sub-array block can be replaced with a redundant row or column of the first memory cell array block.

22. The memory of claim 12 wherein:
   the first interconnect routing channel or each of the second interconnect routing channels includes at least one redundant block of memory cells; and
   each redundant block of memory cells is configured so that one or more defective memory cells in any of the plurality of memory cell array blocks can be replaced with one or more memory cells in the at least one redundant block of memory cells.

23. The memory of claim 1 wherein:
   each lower-level sub-array block comprises a plurality of memory cells arranged along a predesignated number of rows and columns;
   each cell along each row has one or more terminals coupled together to form a wordline extending along the corresponding row of cells; and
   each cell along each column has one or more other terminals coupled to one or more bitlines extending along the corresponding column of cells.

24. The memory of claim 23 wherein each lower-level sub-array block further comprises a data transfer block configured to selectively transfer data between selected ones of the plurality of memory cells and a plurality of data lines.

25. The memory of claim 24 wherein each data transfer block comprises a plurality of sense amplifiers coupled between the plurality of memory cells in the corresponding lower-level sub-block and the plurality of data lines to amplify signals received from the selected ones of said plurality of memory cells and provide the amplified signals on said data lines.

26. The memory of claim 25 wherein each data transfer block further includes a column multiplexer configured to selectively couple the plurality of columns of cells in the corresponding lower-level sub-block to the corresponding plurality of sense amplifiers.

27. The memory of claim 23 wherein the plurality of memory cells are volatile or non-volatile memory cells.

28. The memory of claim 1 wherein the input information includes address bit information for accessing memory locations in the semiconductor memory.

29. The memory of claim 1 wherein:
   each lower-level sub-array block has a first side extending parallel to the second group of local interconnect lines and a second side extending parallel to the first group of local interconnect lines; and
   each lower-level sub-array block is coupled to receive decoded address signals along the first side and to receive or transmit data along the second side.

30. The memory of claim 1 wherein:
   the two sub-array blocks are constructed in a mirror image fashion; and
   the two lower-level sub-array blocks in each sub-array block are constructed in a mirror image fashion.

31. The memory of claim 1 being configured so that in a memory access a selected one of the at least two lower-level sub-array blocks in a selected one of the at least two sub-array blocks transmits or receives data.

32. The memory of claim 1 wherein each of the first and second groups of local interconnect lines is configured to carry at least address signals, decoded address signals, and data signals.

33. The memory of claim 1 wherein the first group of local interconnect lines includes a greater number of interconnect lines than the second group of local interconnect lines in each of the two sub-array blocks.

34. The memory of claim 1 wherein a predesignated number of interconnect lines extending through the first interconnect routing channel have a wider width than a predesignated number of interconnect lines extending through the second interconnect routing channel.

* * * * *